US012812765B2

(12) United States Patent
Ono et al.

(10) Patent No.: US 12,812,765 B2
(45) Date of Patent: Nov. 24, 2026

(54) ELECTRONIC DEVICE FOR TRANSFERRING HEAT FROM HEATING ELEMENT TO COOLING DUCT

(71) Applicant: CANON KABUSHIKI KAISHA, Tokyo (JP)

(72) Inventors: Kenta Ono, Tokyo (JP); Kazuo Yamamoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 40 days.

(21) Appl. No.: 19/049,325

(22) Filed: Feb. 10, 2025

(65) Prior Publication Data

US 2025/0280489 A1 Sep. 4, 2025

(30) Foreign Application Priority Data

Mar. 4, 2024 (JP) ................................ 2024-032030

(51) Int. Cl.
*H05K 1/02* (2006.01)
*H04N 23/52* (2023.01)

(52) U.S. Cl.
CPC ........... *H05K 1/0203* (2013.01); *H04N 23/52* (2023.01); *H05K 2201/064* (2013.01)

(58) Field of Classification Search
CPC ........... H05K 1/0203; H05K 2201/064; H04N 23/52; H04N 23/54; H04N 23/57; G03B 5/06
See application file for complete search history.

(56) References Cited

U.S. PATENT DOCUMENTS

| | | | | |
|---|---|---|---|---|
| 9,159,852 B2 * | 10/2015 | Huang | .................... | H10F 77/60 |
| 2008/0198556 A1 * | 8/2008 | Iwata | .................... | H10F 39/804 361/717 |
| 2019/0020799 A1 * | 1/2019 | Minamisawa | ......... | H05K 1/181 |
| 2025/0358497 A1 * | 11/2025 | Oyama | .................. | H04N 23/54 |

FOREIGN PATENT DOCUMENTS

| | | | | |
|---|---|---|---|---|
| JP | 2001077569 | * | 3/2001 | ............... G06F 1/20 |
| JP | 2001077569 A | | 3/2001 | |
| JP | 2015115417 A | | 6/2015 | |

* cited by examiner

*Primary Examiner* — Hung H Lam
(74) *Attorney, Agent, or Firm* — Cowan, Liebowitz & Latman, P.C.

(57) ABSTRACT

An electronic device being excellent in disassembly workability at the time of repair or the like while sufficiently ensuring thermal conductivity for transferring heat from a heating element to a cooling duct. A circuit board has at least one heating element that generates heat by energization, a cooling duct is disposed to face the circuit board and through which air for cooling the heating element passes, a heat dissipation filler is provided in contact with a surface of the cooling duct facing the circuit board and having thermal conductivity for transferring heat from the heating element to the cooling duct, a flexible member is provided between the circuit board and the heat dissipation filler and having flexibility, and a positioning unit which positions the flexible member at a position where contact between the circuit board and the heat dissipation filler can be prevented.

14 Claims, 15 Drawing Sheets

ELECTRONIC DEVICE FOR TRANSFERRING HEAT FROM HEATING ELEMENT TO COOLING DUCT

BACKGROUND OF THE INVENTION

Field of the Invention

The present invention relates to an electronic device.

Description of the Related Art

In recent image pickup apparatuses, image quality has been improved by, for example, an increase in resolution, an increase in frame rate, and the like of recorded video. In such an image pickup apparatus, a processing load on an electronic component such as an IC chip mounted on a control circuit board increases with the improvement in image quality, and as a result, the electronic component significantly generates heat. Since heat generated in the electronic component may cause performance degradation, failure, or the like of the image pickup apparatus, a cooling structure for cooling the electronic component is provided. As the cooling structure, for example, a liquid heat dissipation member called heat dissipation grease or heat conductive grease may be used (see, for example, Japanese Laid-Open Patent Publication (kokai) No. 2015-115417 and Japanese Laid-Open Patent Publication (kokai) No. 2001-77569). In general, the liquid heat dissipation member has excellent heat reduction properties for reducing contact thermal resistance or the like generated at a contact surface between components as compared with a solid heat dissipation member such as a heat dissipation sheet.

However, in each of Japanese Laid-Open Patent Publication (kokai) No. 2015-115417 and Japanese Laid-Open Patent Publication (kokai) No. 2001-77569, since grease is used for the liquid heat dissipation member, there is a problem that the liquid heat dissipation member leaks or adheres to gloves or work clothes depending on the skill level of an operator, for example, at the time of assembly or disassembly work. A heat dissipation gap filler may be used instead of the grease. The "heat dissipation gap filler" is a paste-like filler containing a filler having thermal conductivity, and can be cured with time after being applied to a predetermined portion as a cooling structure. Then, the heat dissipation gap filler in a cured state has extremely strong adhesive force to the predetermined portion. Therefore, for example, even if the heat dissipation gap filler in the cured state is tried to be peeled off from the predetermined portion at the time of disassembly work, it is difficult to peel off the heat dissipation gap filler, and there arises a problem that workability is deteriorated.

SUMMARY OF THE INVENTION

The present invention provides an electronic device excellent in disassembly workability at the time of repair or the like while sufficiently ensuring thermal conductivity for transferring heat from a heating element to a cooling duct.

According to an aspect of the invention, the present invention provides an electronic device comprising a circuit board having at least one heating element that generates heat by energization, a cooling duct disposed to face the circuit board and through which air for cooling the heating element passes, a heat dissipation filler provided in contact with a surface of the cooling duct facing the circuit board and having thermal conductivity for transferring heat from the heating element to the cooling duct, a flexible member provided between the circuit board and the heat dissipation filler and having flexibility, and a positioning unit configured to position the flexible member at a position where contact between the circuit board and the heat dissipation filler can be prevented.

According to the present invention, it is possible to achieve excellent disassembly workability at the time of repair or the like while sufficiently ensuring the thermal conductivity for transferring heat from the heating element to the cooling duct.

Further features of the present invention will become apparent from the following description of exemplary embodiments (with reference to the attached drawings).

DESCRIPTION OF THE EMBODIMENTS

Hereinafter, embodiments of the present invention will be described in detail with reference to the drawings. However, configurations described in the following embodiments are merely examples, and the scope of the present invention is not limited by the configurations described in the embodiments. For example, each of parts constituting the present invention can be replaced with a unit having any configuration capable of exhibiting a similar function. Further, an arbitrary component may be added. Furthermore, any two or more configurations (features) of the embodiments may be combined.

Hereinafter, a first embodiment will be described with reference to FIGS. 1 to 10.

External Configuration of Image Pickup Apparatus

Figure 1:
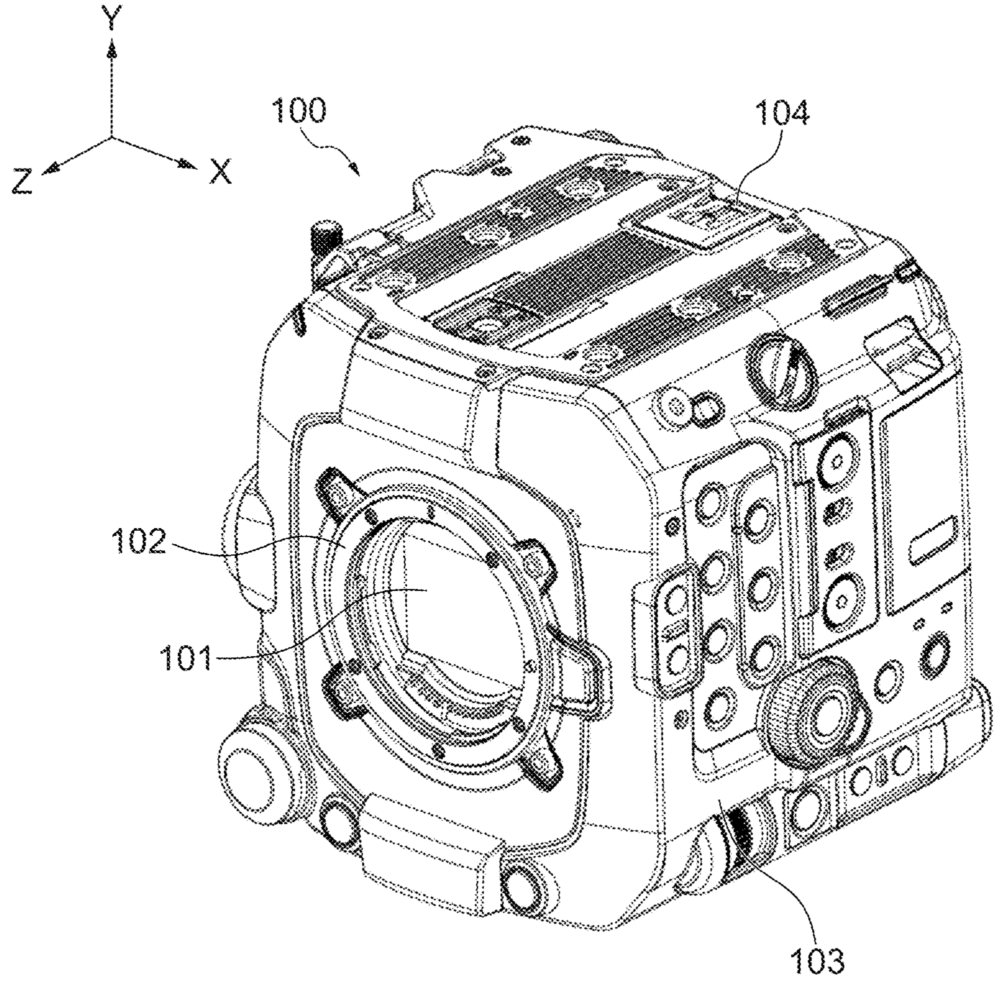
FIG. 1 is an external perspective view of an image pickup apparatus to which an electronic device according to a first embodiment is applied as viewed from an upper front.
Figure 2:
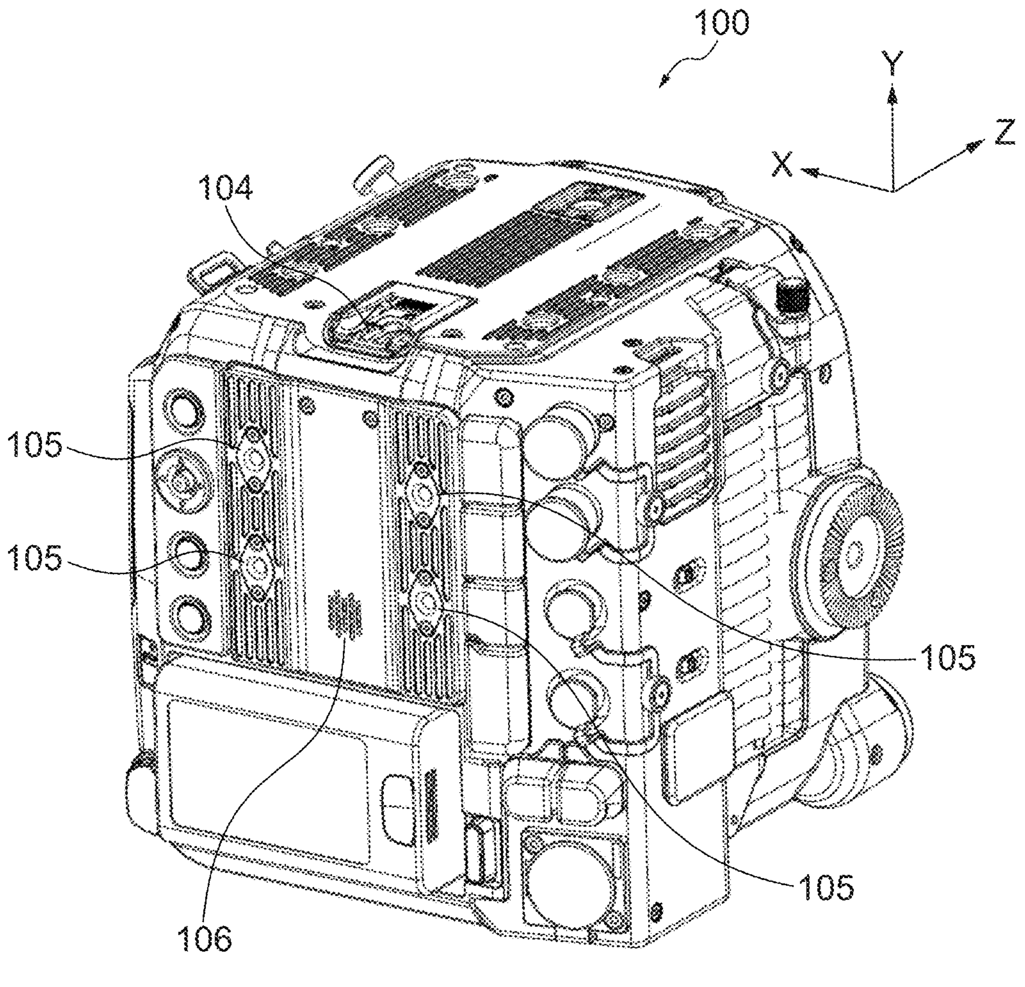
FIG. 2 is an external perspective view of the image pickup apparatus to which the electronic device according to the first embodiment is applied as viewed from an upper rear.

FIG. 1 is an external perspective view of an image pickup apparatus to which an electronic device according to the first embodiment is applied as viewed from an upper front. FIG. 2 is an external perspective view of the image pickup apparatus to which the electronic device according to the first embodiment is applied as viewed from an upper rear. It should be noted that as shown in FIGS. 1 and 2, in the present embodiment, an X axis, a Y axis, and a Z axis orthogonal to each other are set (the same applies to FIG. 3 and subsequent figures). The Z axis is an axis set parallel to a front-rear direction of an image pickup apparatus 100, that is, an axis perpendicular to an image pickup surface 101. In the Z axis, a direction from the rear surface side to the front surface side of the image pickup apparatus 100 is defined as a positive direction, and the opposite direction is defined as a negative direction. The Y axis is an axis set in parallel with an up-down direction of the image pickup apparatus 100. In the Y axis, a direction from a lower surface to an upper surface of the image pickup apparatus 100 is defined as a positive direction, and the opposite direction is defined as a negative direction. The X axis is an axis set in parallel with a left-right direction of the image pickup apparatus 100. In the X axis, a direction from a left side surface to a right side surface of the image pickup apparatus 100 when the image pickup apparatus 100 is viewed from the front is defined as a positive direction, and the opposite direction is defined as a negative direction. The image pickup apparatus 100 has an image pickup function of shooting a moving image or a still image, and is an apparatus to which the electronic device of the present invention is applied.

As shown in FIG. 1, the image pickup apparatus 100 includes a lens attachment part 102 provided on a front surface, and an image pickup surface 101 provided on the negative side in the Z-axis direction with respect to the lens attachment part 102, that is, on the rear side with respect to the lens attachment part 102. A lens barrel (not shown) including plural types of lenses having different optical performances is detachably attached to the lens attachment part 102. The lens barrel is communicably connected to the image pickup apparatus 100 in a state of being attached to the lens attachment part 102. Thus, each of the lenses can be driven. Further, the lens barrel forms an image on the image pickup surface 101 by each of the lenses in the state of being attached to the lens attachment part 102. The image pickup surface 101 generates video data based on an optical image formed on the image pickup surface 101. Further, the image pickup apparatus 100 includes an operation member 103 provided on the right side surface and an accessory mounting electrical contact 104 provided on an upper surface. The operation member 103 includes, for example, a plurality of buttons, dials, and the like. By operating the operation member 103, for example, it is possible to switch ON/OFF of a power supply of the image pickup apparatus 100, start/stop image pickup, adjust an image and sound, and the like. The accessory mounting electrical contact 104 communicably connects an external accessory detachably mounted on the upper side of the image pickup apparatus 100 and the image pickup apparatus 100. Thus, the external accessory can be controlled. The external accessory is not particularly limited, and examples thereof include a microphone, a lighting device, and a handle. As shown in FIG. 2, the image pickup apparatus 100 includes a general-purpose accessory attachment part 105 and a speaker 106 provided on the rear surface. A general-purpose accessory can be attached to the general-purpose accessory attachment part 105. The general-purpose accessory is not particularly limited, and examples thereof include a tripod. The speaker 106 emits out the sound of the moving image, for example.

Internal Configuration of Image Pickup Apparatus

Figure 3:
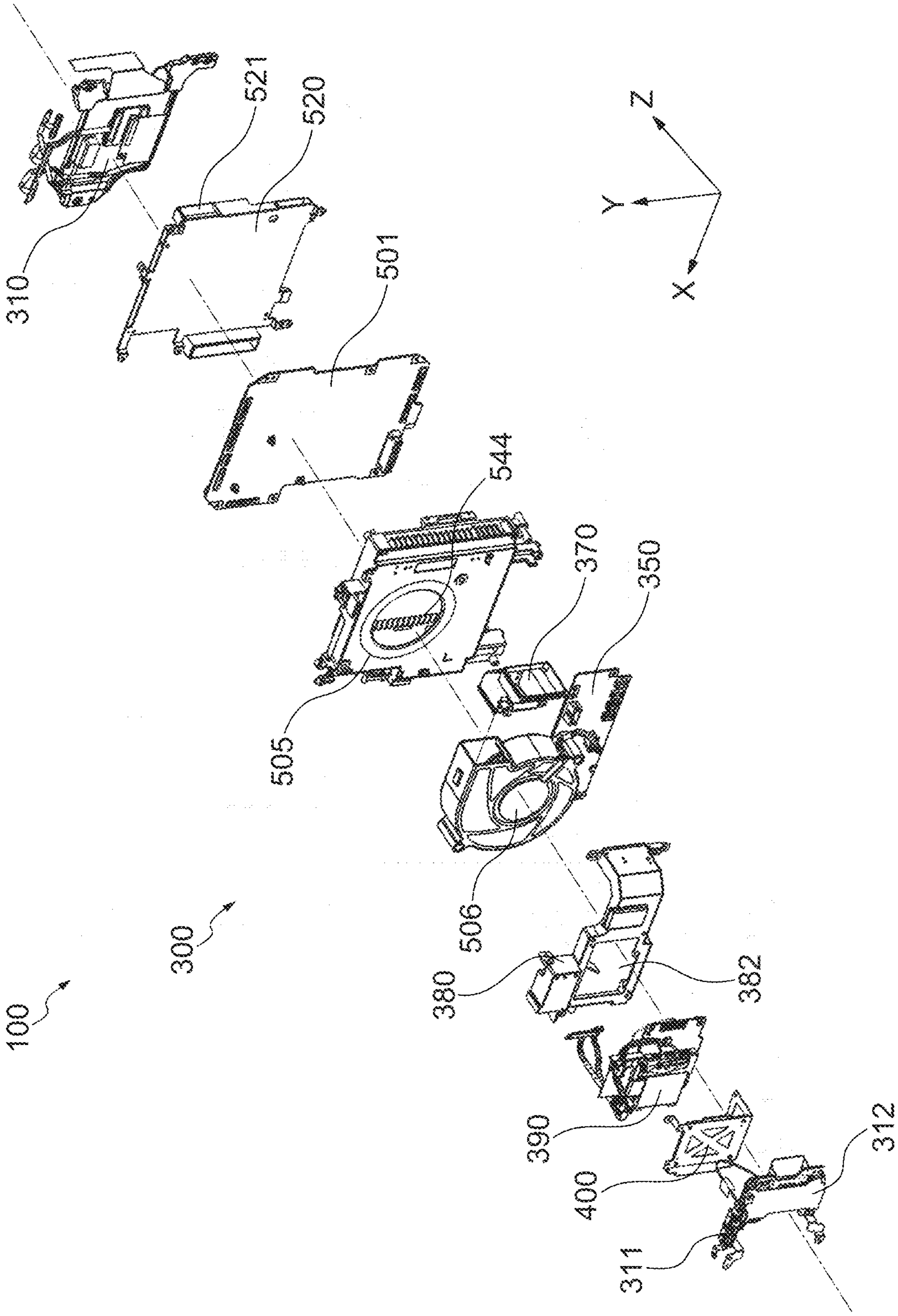
FIG. 3 is an exploded perspective view showing an internal configuration of the image pickup apparatus.

FIG. 3 is an exploded perspective view showing an internal configuration of the image pickup apparatus. As shown in FIG. 3, the image pickup apparatus 100 has an internal structure 300. Internal structure 300 includes an image pickup device 310, a sensor duct unit 520, a control circuit board (circuit board) 501, a forced air cooling duct (cooling duct) 505, a power supply board 350, and a cooling fan (fan) 506. Further, the internal structure 300 includes a media duct unit 380, a media substrate 390, a sub-media substrate 400, and a wireless substrate 312. These members constituting the internal structure 300 are arranged from the positive side to the negative side in an optical axis direction, that is, the Z-axis direction. Further, the members adjacent to each other in the Z-axis direction are arranged to face each other. The image pickup device 310 has the image pickup surface 101 that converts light transmitted through each of the lenses into an electric signal. The control circuit board 501 is a board that controls the entire image pickup apparatus 100. The control circuit board 501 is a board on which a plurality of elements is mounted and which has the largest area in the internal structure 300. The element executed on the control circuit board 501 is not particularly limited, and examples thereof include an element for processing a signal from the image pickup device 310, an element for executing processing such as color adjustment of a video, and a memory used for these elements. The power supply board 350 constitutes a power supply circuit that supplies power to electric components in the image pickup apparatus 100 together with the control circuit board 501. The media substrate 390 is a substrate for recording a main video on a recording medium. The sub-media substrate 400 is a substrate that stores a setting state of an image pickup condition and records a backup video in which a data capacity of the main video recorded on the media substrate 390 is reduced. The media duct unit 380 is provided with an opening 382 penetrating in the Z-axis direction. The media substrate 390 is configured so that at least a part thereof is exposed through the opening 382. The wireless substrate 312 is electrically connected to a wireless antenna 311 and controls wireless communication with an external device. The wireless antenna 311 is disposed in an upper rear part of the internal structure 300.

Forced Air Cooling Structure in Internal Structure

Figure 4:
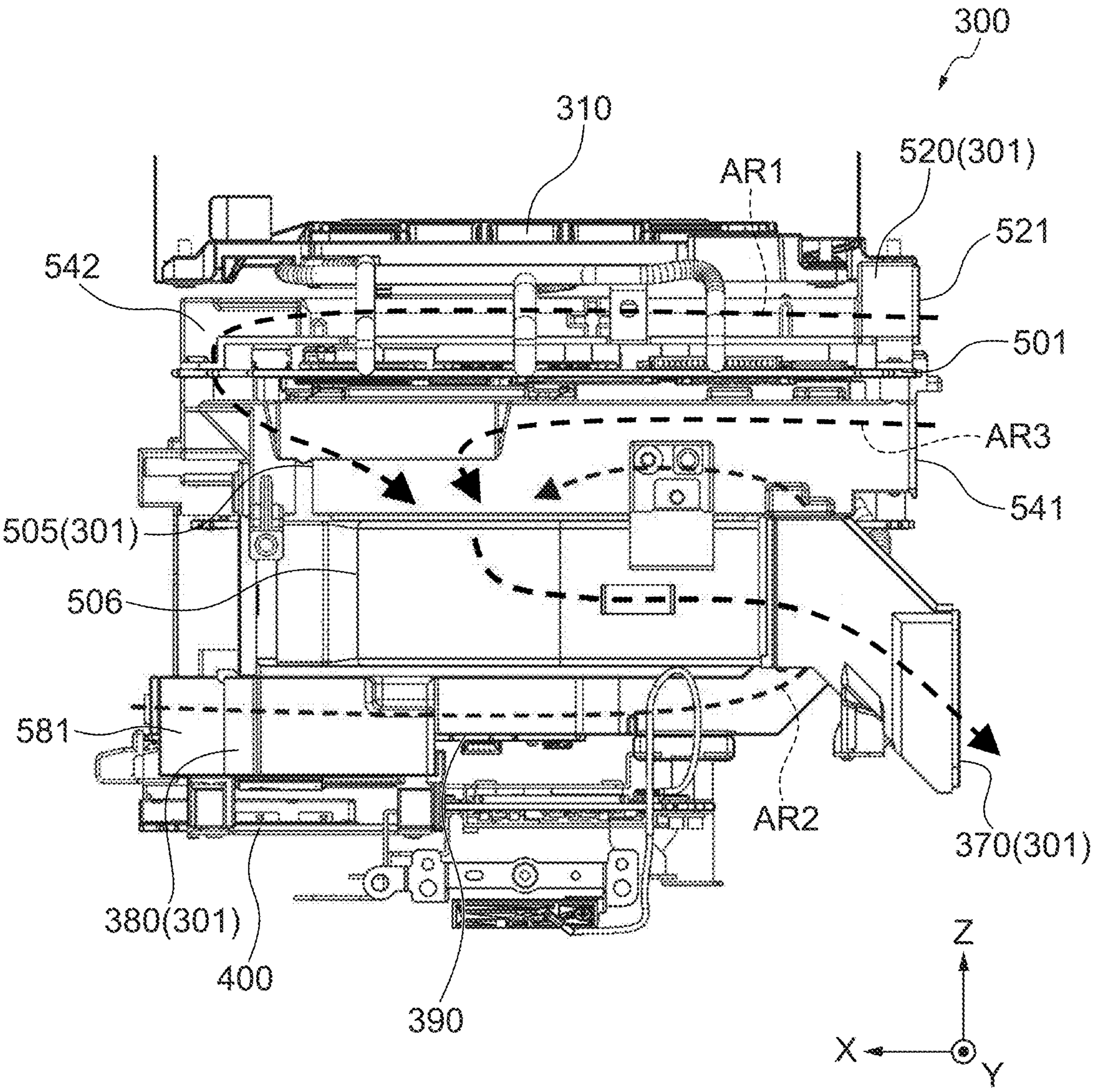
FIG. 4 is a plan view of a forced air cooling structure in an internal structure.
Figure 5A:
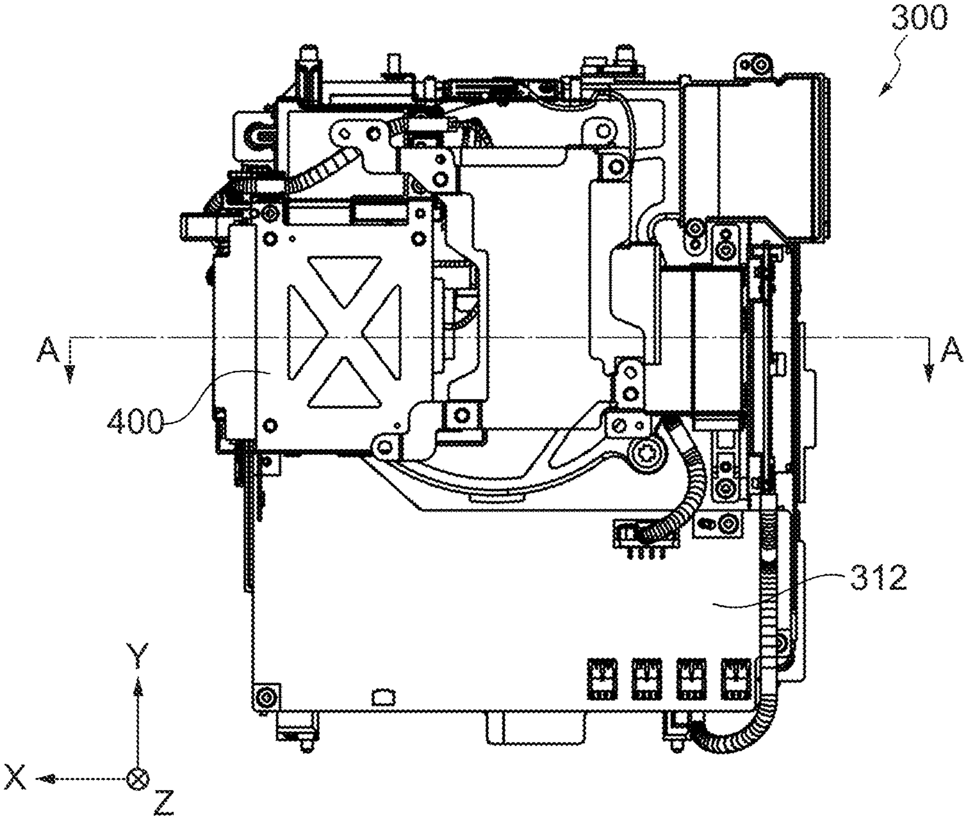
FIGS. 5A and 5B are plan views of the forced air cooling structure in the internal structure.
Figure 5B:
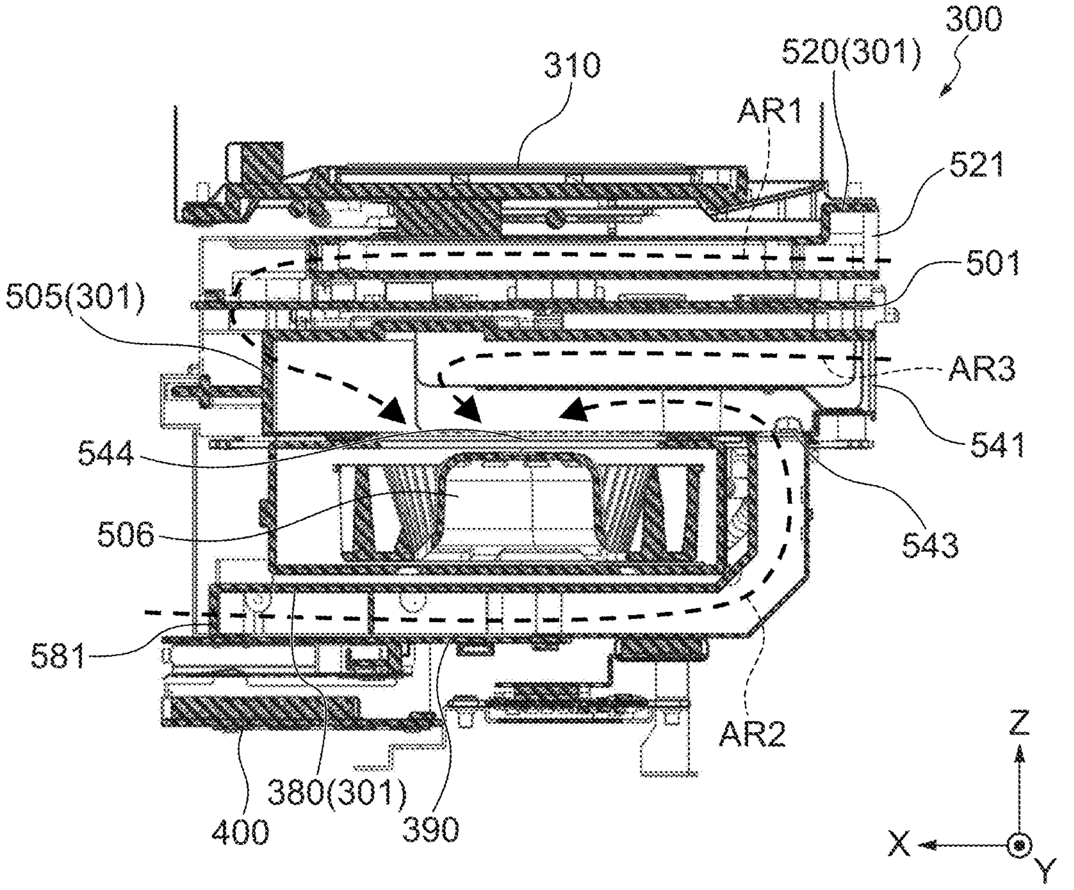

FIGS. 4, 5A, and 5B are each plan views of the forced air cooling structure in the internal structure. It should be noted that FIG. 4 is a plan view of the forced air cooling structure in the internal structure as viewed from the positive side in the Y-axis direction. FIG. 5A is a plan view of the forced air-cooling structure in the internal structure as viewed from the negative side in the Z-axis direction. FIG. 5B is a sectional view taken along line A-A in FIG. 5A. As shown in FIG. 4, the forced air cooling structure of the internal structure 300 includes a heat dissipation duct 301 and the cooling fan 506. As described above, the plurality of elements is mounted on the control circuit board 501. These elements are heating elements (heating elements 610 to be described later) that generate heat by energization. The forced air cooling structure is configured to be able to release heat from each element, that is, each heating element. It should be noted that the number of elements mounted on the control circuit board 501 is plural in the present embodiment, but is not limited thereto, and may be at least one. Further, in the present embodiment, each element is provided on a surface (surface 501*a* to be described later) of the control circuit board 501 facing the forced air cooling duct 505, that is, a surface facing the negative side in the Z-axis direction, but is not limited thereto. For example, the elements may be provided on a surface of the control circuit board 501 facing the positive side in the Z-axis direction, or may be provided in a dispersed manner on the surface of the control circuit board 501 facing the positive side in the Z-axis direction and a surface of the control circuit board 501 facing the negative side in the Z-axis direction. The heat dissipation duct 301 includes the sensor duct unit 520, the forced air cooling duct 505, the media duct unit 380, and an exhaust duct unit 370.

The sensor duct unit 520 has a sensor duct intake port 521 that opens to the negative side in the X-axis direction. Air (Outside air) AR is sucked into the sensor duct intake port 521. The sensor duct unit 520 is coupled to the forced air cooling duct 505 via a sensor duct coupling part 542. Thus, the sensor duct unit 520 and the forced air cooling duct 505 communicate with each other, so that air AR1 sucked into the sensor duct intake port 521 can sequentially pass through the sensor duct unit 520 and the forced air cooling duct 505. It should be noted that the heat generated in the image pickup device 310 is transmitted to the sensor duct unit 520 via a heat conduction member (not shown) such as a graphite sheet. Then, the heat is cooled as the air AR1 passes through the sensor duct unit 520.

As shown in FIG. 5B, the media duct unit 380 has a media duct intake port 581 opened to the positive side in the X-axis direction. Air AR2 is sucked into the media duct intake port 581. The media duct unit 380 is coupled to the forced air cooling duct 505 via a media duct coupling part 543. Thus, the media duct unit 380 and the forced air cooling duct 505 communicate with each other, so that the air AR2 sucked into the media duct intake port 581 can sequentially pass through the media duct unit 380 and the forced air cooling duct 505. As described above, at least a part of the media substrate 390 is exposed through the opening 382 of the media duct unit 380. Thus, the heat generated in the media substrate 390 is cooled as the air AR2 passes through the media duct unit 380. The sub-media substrate 400 is disposed on the negative side in the Z-axis direction with respect to the media substrate 390. Since the sub-media substrate 400 is a substrate on which small data is written, and thus an amount of heat generation is also relatively small. Therefore, forced cooling of the sub-media substrate 400 may be omitted.

The forced air cooling duct 505 has a forced air cooling duct intake port 541 that opens to the positive side in the X-axis direction. Air AR3 is sucked into the forced air cooling duct intake port 541. Thus, the air AR3 can pass through the forced air cooling duct 505. It should be noted that the heat generated in the control circuit board 501 (in particular, the heating element) is cooled as the air AR3 passes through the forced air cooling duct 505. A part of the heat generated in the control circuit board 501 is also cooled in the sensor duct unit 520. The cooling fan 506 is coupled to the forced air cooling duct 505 via a cooling fan coupling hole 544. This places the cooling fan 506 and the forced air cooling duct 505 in communication with each other, and thus when the cooling fan 506 operates, the air AR1 to the air AR3 are forced to pass to the forced air cooling duct 505. The cooling fan 506 has the exhaust duct unit 370 that opens to the positive side in the X-axis direction. The air AR1 to the air AR3 having passed through the forced air cooling duct 505 are discharged to an outside of the image pickup apparatus 100 via the exhaust duct unit 370 by operation of the cooling fan 506.

Configuration of Main Unit

Figure 6:
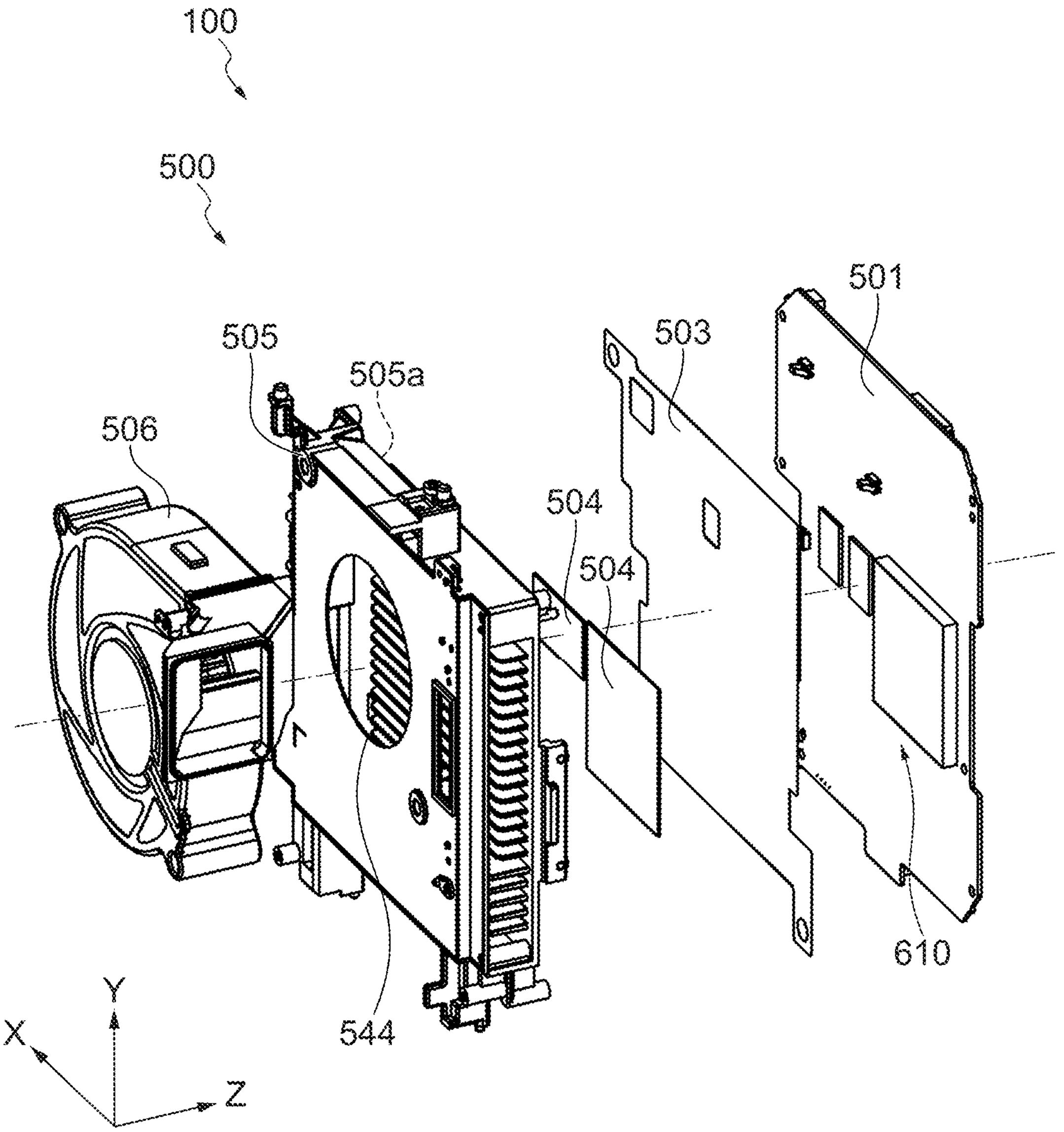
FIG. 6 is an exploded perspective view of a main unit of the image pickup apparatus.

FIG. 6 is an exploded perspective view of a main unit of the image pickup apparatus. As shown in FIG. 6, the image pickup apparatus 100 has a main unit 500. The main unit 500 includes the control circuit board 501, a film (flexible member) 503, a heat dissipation gap filler (heat conduction member) 504, the forced air cooling duct 505, and the cooling fan 506. These members constituting the main unit 500 are arranged in order from the positive side to the negative side in a normal direction of the control circuit board 501, that is, the Z-axis direction. Therefore, among these members, the control circuit board 501 is located closest to a subject side. The forced air cooling duct 505 is a flat member disposed to face the control circuit board 501. The forced air cooling duct 505 is made of a metal material having relatively high thermal conductivity, such as aluminum, and is thermally connected to the heating element 610 mounted on the control circuit board 501. As described above, the heating element 610 is an element that generates heat by energization. The heat generated by the heating element 610 is heat-exchanged with the air AR2 sucked into the forced air cooling duct 505 by rotation of the cooling fan 506. Thus, the heating element 610 can be forcibly cooled.

The heat dissipation gap filler (heat dissipation filler) 504 is disposed between the heating element 610 and the forced air cooling duct 505. The heat dissipation gap filler 504 is a heat conduction member that transfers heat from the heating element 610 to the forced air cooling duct 505. In the present embodiment, the heat dissipation gap filler 504 is provided in contact with a surface 505*a* of the forced air cooling duct 505 facing the control circuit board 501, that is, the surface 505*a* facing the positive side in the Z-axis direction. The heat dissipation gap filler 504 has a paste shape, and is cured over time after being applied to the surface 505*a*. Then, the heat dissipation gap filler 504 in a cured state has extremely strong adhesive force to the surface 505*a*, and is difficult to peel off from the surface 505*a*. It should be noted that the shape of the heat dissipation gap filler 504 in the cured state is a flat shape in configuration shown in FIG. 6, but is not limited thereto. Further, the heat dissipation gap filler 504 is not particularly limited, and for example, a material containing ceramic fillers having thermal conductivity and a binder including a silicone-based resin that bonds the fillers can be used.

Here, in the image pickup apparatus 100, it is conceivable to use a heat dissipation sheet having flexibility instead of the heat dissipation gap filler 504. In general, the heat dissipation sheet is used in a state of being sandwiched between members to be heat-exchanged. However, depending on various conditions such as a material constituting the heat dissipation sheet and a thickness of the heat dissipation sheet, there is a possibility that a force for deforming each member is generated from the heat dissipation sheet on each member. In this case, the control circuit board 501 may be deformed such as bent by the force from the heat dissipation sheet, resulting in a defect or failure. In contrast, since the heat dissipation gap filler 504 is in the cured state, the above concern can be eliminated as compared with the heat dissipation sheet. It is also conceivable to use heat dissipation grease instead of the heat dissipation gap filler 504. Unlike the heat dissipation gap filler 504, the heat dissipation grease is not in the cured state and remains as liquid. Thus, the heat dissipation gap filler 504 can prevent, for example, pumping out due to contraction and expansion by heat and leakage due to vibration as compared with the heat dissipation grease.

Arrangement of Heating Element (Element) on Control Circuit Board

Figure 7:
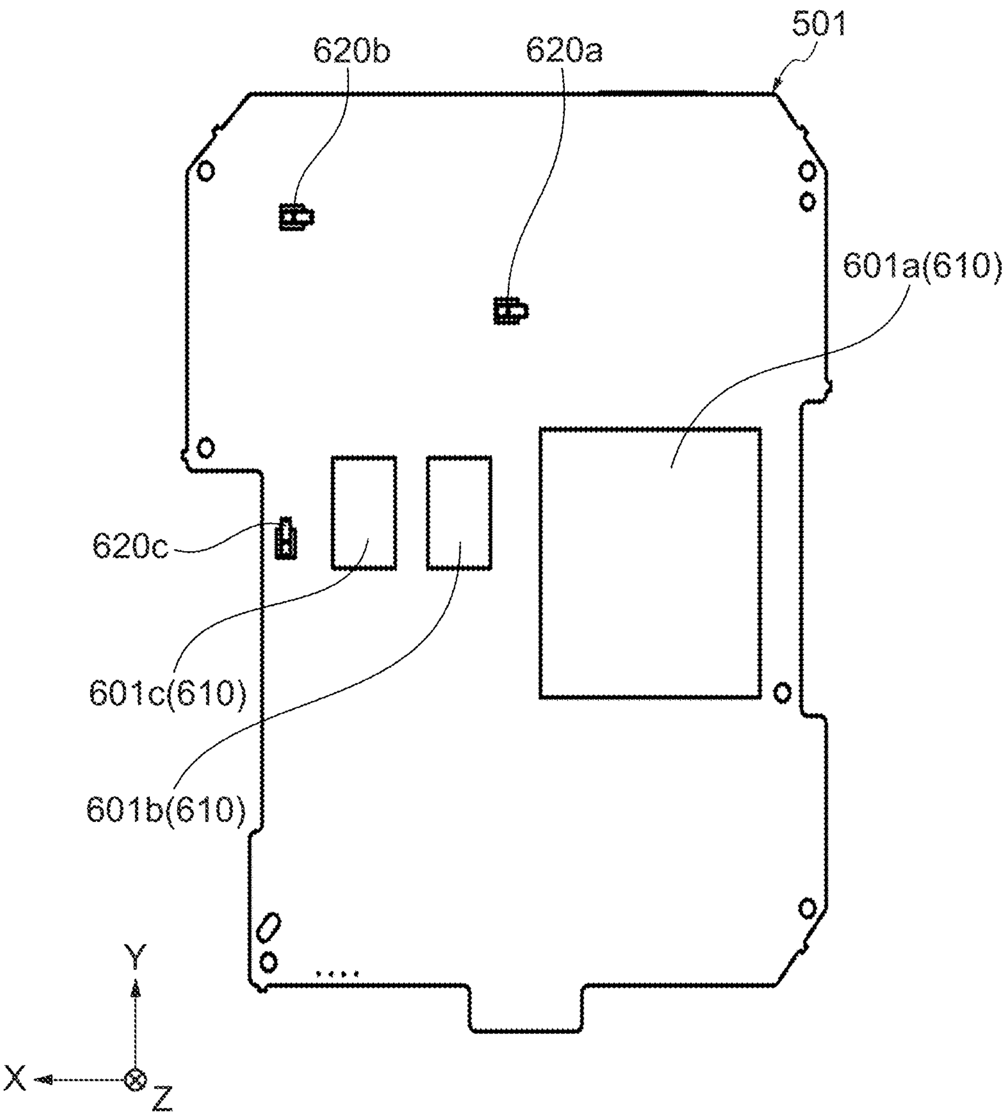
FIG. 7 is a plan view of a control circuit board.

FIG. 7 is a plan view of the control circuit board. As shown in FIG. 7, a heating element 601*a*, a heating element 601*b*, and a heating element 601*c* are mounted as the heating element 610 on the surface 501*a* facing the negative side in the Z-axis direction of the control circuit board 501. The heating elements 601*a* to 601*c* are arranged at intervals in the X-axis direction. Each of the heating elements 601*a* to 601*c* is, for example, a CPU. It should be noted that shapes and sizes of the heating elements 601*a* to 601*c* are not limited to those of configuration shown in FIG. 7. The number of heating elements constituting the heating element 610 is 3 in the configuration shown in FIG. 7, but is not limited thereto, and may be, for example, 1, 2, or 4 or more. On the surface 501*a* of the control circuit board 501, a conductive member 620*a*, a conductive member 620*b*, and a conductive member 620*c* are mounted. Although the conductive members 620*a* to 620*c* are arranged at intervals, arrangement positions thereof are not particularly limited. Each of the conductive members 620*a* to 620*c* projects from the surface 501*a* and functions as a connection part electrically connected to the forced air cooling duct 505. It should be noted that shapes and sizes of the conductive members 620*a* to 620*c* are not limited to those of the configuration shown in FIG. 7. In addition, the number of conductive members is three in the configuration shown in FIG. 7, but is not limited thereto, and may be, for example, one, two, or four or more.

Relationship Between Heat Dissipation Gap Filler and Film

Figure 8:
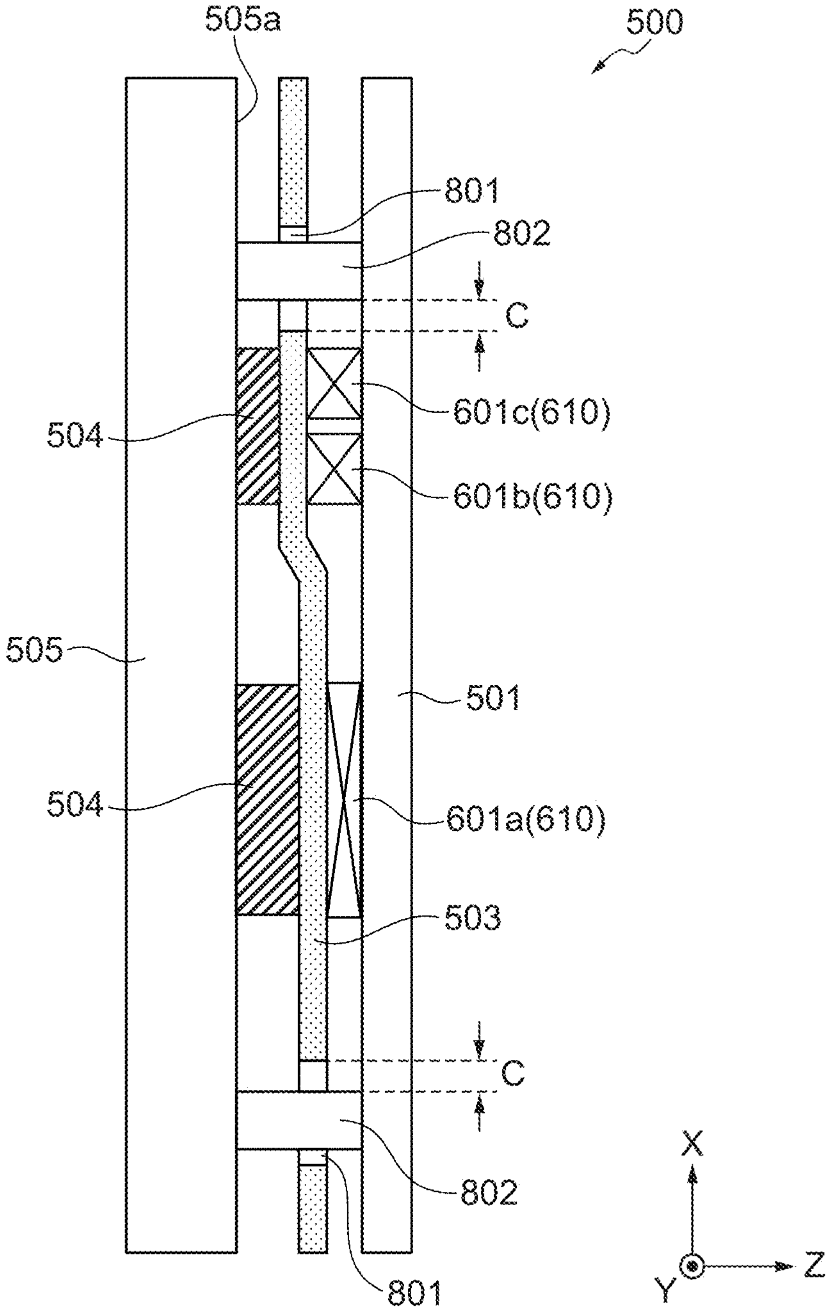
FIG. 8 is a diagram showing a positional relationship in an assembled state of the control circuit board, a film, a heat dissipation gap filler, and a forced air cooling duct.

FIG. 8 is a diagram showing a positional relationship in an assembled state of the control circuit board, the film, the heat dissipation gap filler, and the forced air cooling duct. As shown in FIG. 8, the film 503 is disposed between the heating element 610 of the control circuit board 501 and the heat dissipation gap filler 504. The film 503 is a sheet-like member having flexibility. The constituent material of the film 503 is not particularly limited, and is, for example, a resin material such as polyester. The thickness of the film 503 is preferably, for example, several um to several tens mm. When heat is generated from the heating element 610, the heat can be quickly transmitted to the forced air cooling duct 505 through the film 503 and the heat dissipation gap filler 504 in this order. As described above, the film 503 can sufficiently ensure the thermal conductivity.

The film 503 is sandwiched between the heating element 610 and the heat dissipation gap filler 504. Thus, it is possible to prevent the heating element 610 and the heat dissipation gap filler 504 from coming into close contact with each other (coming into contact with each other). Then, due to this adhesion preventing effect, when the main unit 500 is disassembled, for example, to repair the control circuit board 501 or to replace the heating element 610, the forced air cooling duct 505 can be easily separated from the control circuit board 501 together with the heat dissipation gap filler 504. Thus, it is possible to omit an operation in which a part of the heat dissipation gap filler 504 remains on the control circuit board 501 and the heat dissipation gap filler 504 is removed from the control circuit board 501. As a result, repair of the control circuit board 501, replacement of the heating element 610, and the like can be easily performed. Since the film 503 is disposed between the heating element 610 of the control circuit board 501 and the heat dissipation gap filler 504 in an assembled state of the main unit 500 as described above, disassembly workability at the time of repair or the like is excellent. It should be noted that in a disassembled state of the main unit 500, the film 503 directly adheres to the heat dissipation gap filler 504 or is peeled off from the heat dissipation gap filler 504. When the film 503 directly adheres to the heat dissipation gap filler 504, the film 503 may be peeled off from the heat dissipation gap filler 504 and replaced with a new film 503. As described above, the film 503 has flexibility, and the thickness is preferably in the above numerical range. Due to combination of the flexibility and the numerical range, the film 503 can easily and sufficiently follow and adhere to the heating element 610 and the heat dissipation gap filler 504 regardless of the number, arrangement positions, and surface shapes of the heating elements 610 and the heat dissipation gap fillers 504.

Positioning of Film

As described above, the film 503 is a member capable of exhibiting the adhesion preventing effect of preventing the heating element 610 of the control circuit board 501 and the heat dissipation gap filler 504 from adhering to each other. However, since the film 503 is made of a sheet material having flexibility, positional displacement tends to easily occur, and when the positional displacement occurs, the adhesion preventing effect may not be sufficiently exhibited. Therefore, the main unit 500 (image pickup apparatus 100) is configured so that film 503 can be positioned, that is, positional displacement can be prevented. Hereinafter, this configuration and operation will be described.

Figure 9:
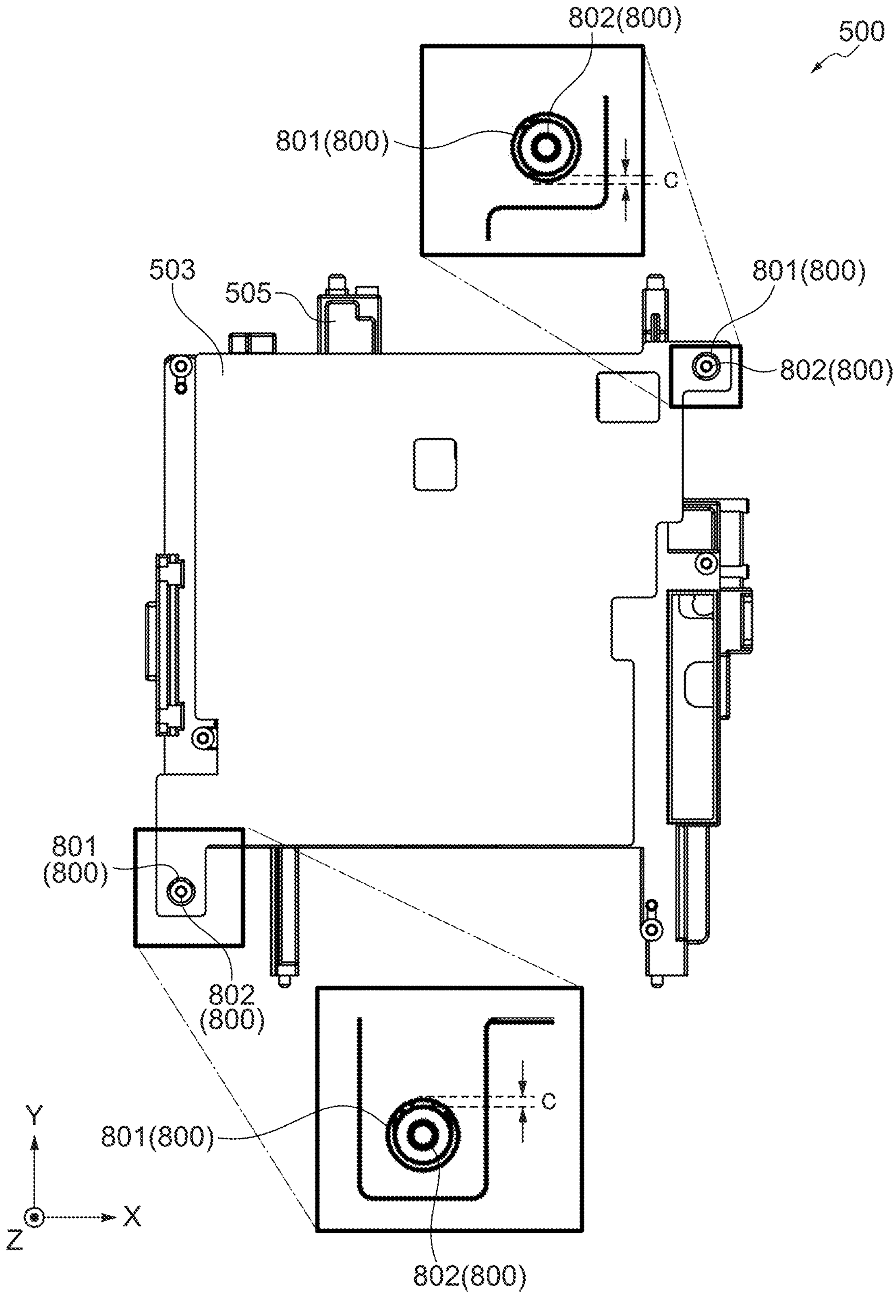
FIG. 9 is a front view of the film and the forced air cooling duct as viewed from a front surface side of the image pickup apparatus.

FIG. 9 is a front view of the film and the forced air cooling duct as viewed from the front surface side of the image pickup apparatus. As shown in FIG. 9, the main unit 500 has a positioning unit 800 that positions the film 503. The positioning unit 800 is configured to position the film 503 at a position where close contact between the heating element 610 of the control circuit board 501 and the heat dissipation gap filler 504 can be prevented. Hereinafter, a state in which the film 503 is positioned may be referred to as a "positioning state". In the present embodiment, the positioning unit 800 has a through-hole (positioning hole) 801 provided to penetrate the film 503, and a projecting part 802 provided to project toward the positive side in the Z axis direction on the forced air cooling duct 505. The projecting part 802 is constituted by, for example, a boss (pin) screwed or press-fitted into forced air cooling duct 505, and passes through through-hole 801. Two through-holes 801 and two projecting parts 802 are provided. When viewed from the Z-axis direction, the two through-holes 801 are arranged on opposite sides to each other with the heating element 610 interposed therebetween (see FIGS. 8 and 9). On the other hand, similarly to the through-holes 801, the two projecting parts 802 are also arranged on opposite sides to each other with the heating element 610 interposed therebetween (see FIGS. 8 and 9). Thus, two positioning positions for the film 503 can be arranged as far apart as possible. It should be noted that in positioning, it is preferable to arrange the two positioning positions as far apart as possible.

With the positioning unit 800 having such a configuration, the position of the film 503 in the X-axis direction and the Y-axis direction is regulated, and the film is reliably positioned at a position where the heating element 610 and the heat dissipation gap filler 504 can be prevented from coming into close contact with each other. This prevent the positional displacement of the film 503, and thus a state in which the adhesion preventing effect by the film 503 is exhibited is maintained. As described above, the film 503 is sandwiched between the heating element 610 and the heat dissipation gap filler 504. This regulates the position of the film 503 in the Z-axis direction. Due to combination of this position regulation in the Z-axis direction and position regulation in the X-axis direction and the Y-axis direction by the positioning unit 800, the positioning state of the film 503 is more reliably maintained.

The projecting part 802 has a columnar shape. The through-hole 801 has a circular shape, and its radius is larger than that of the projecting part 802 by a clearance C. Therefore, in the present embodiment, the columnar projecting part 802 and the circular through-hole 801 are in a clearance fit relationship. This improves followability (shape followability) of the film 503 with respect to the heating element 610 and the heat dissipation gap filler 504 described above. It should be noted that the number of the through-holes 801 and the projecting parts 802 formed is two in the present embodiment, but is not limited thereto, and may be at least two. In the present embodiment, the projecting part 802 is provided on the forced air cooling duct 505, but is not limited thereto, and for example, may be provided on the control circuit board 501. In the present embodiment, the positioning unit 800 is configured to have the through-hole 801 and the projecting part 802, but is not limited thereto, and for example, may be provided in a part of the main unit 500 and may be constituted by a portion that can be positioned by abutting an edge of the film 503.

Figure 10:
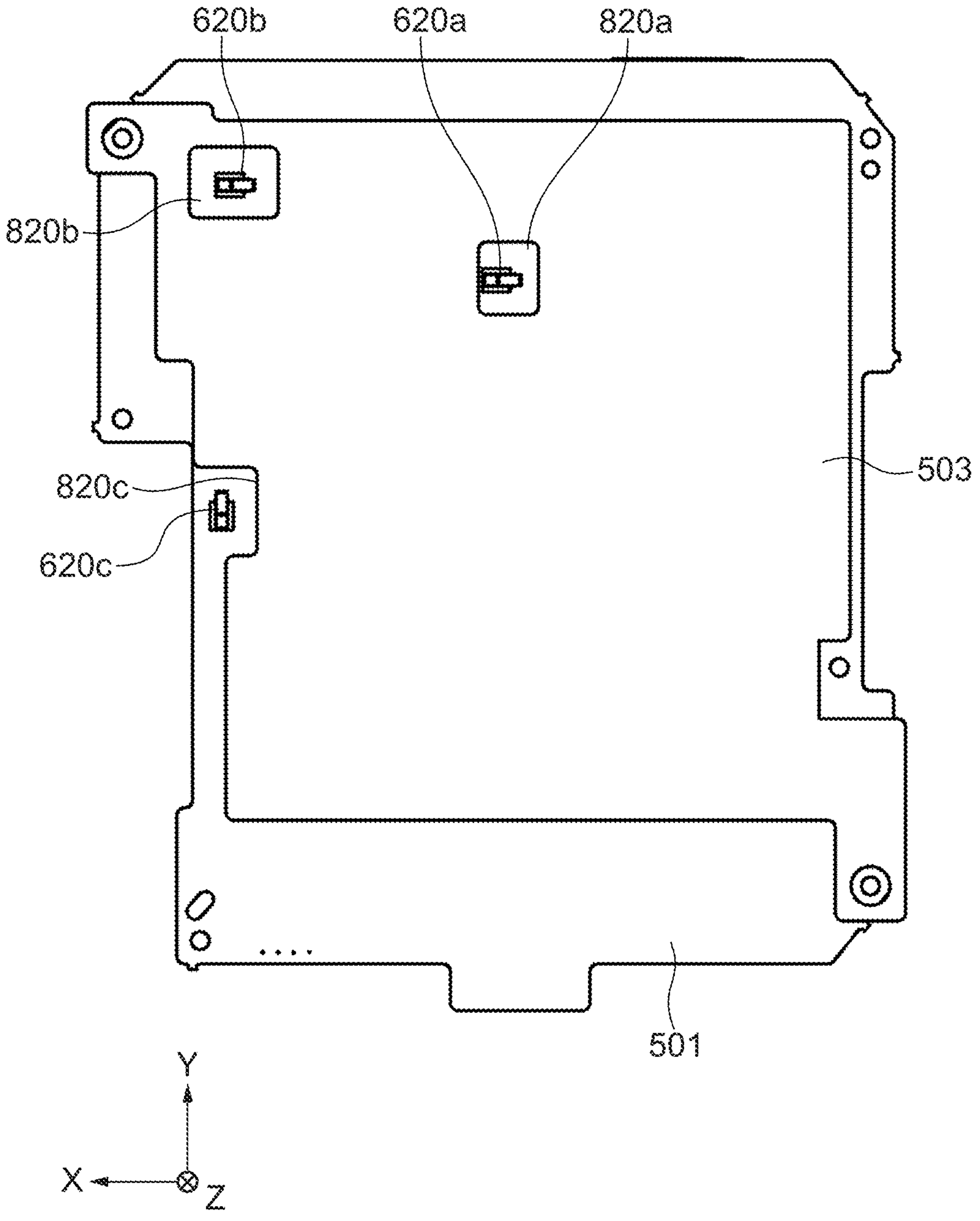
FIG. 10 is a rear view of the control circuit board and the film as viewed from a rear surface side of the image pickup apparatus.

FIG. 10 is a rear view of the control circuit board and the film as viewed from the rear surface side of the image pickup apparatus. As shown in FIG. 10, the film 503 includes a relief 820*a* for avoiding interference with the conductive member 620*a* of the control circuit board 501 in the positioning state, a relief 820*b* for avoiding interference with the conductive member 620*b*, and a relief 820*c* for avoiding interference with the conductive member 620*c*. Each of the relief 820*a* and the relief 820*b* is formed to penetrate the film 503, and the relief 820*c* is formed by the edge of the film 503 entering toward the center side of the film 503. Due to such reliefs 820*a* to 820*c*, the conductive members 620*a* to 620*c* are exposed toward the forced air cooling duct 505. Thus, the conductive members 620*a* to 620*c* can be electrically connected to the forced air cooling duct 505. The conductive member 620*a* and the conductive member 620*c* also function as vent holes through which the air passes. This improves heat dissipation. In addition, since deformation is facilitated in peripheral portions of the conductive member 620*a* and the conductive member 620*c*, the followability of the film 503 with respect to the heating element 610 and the heat dissipation gap filler 504 described above is improved.

Figure 11:
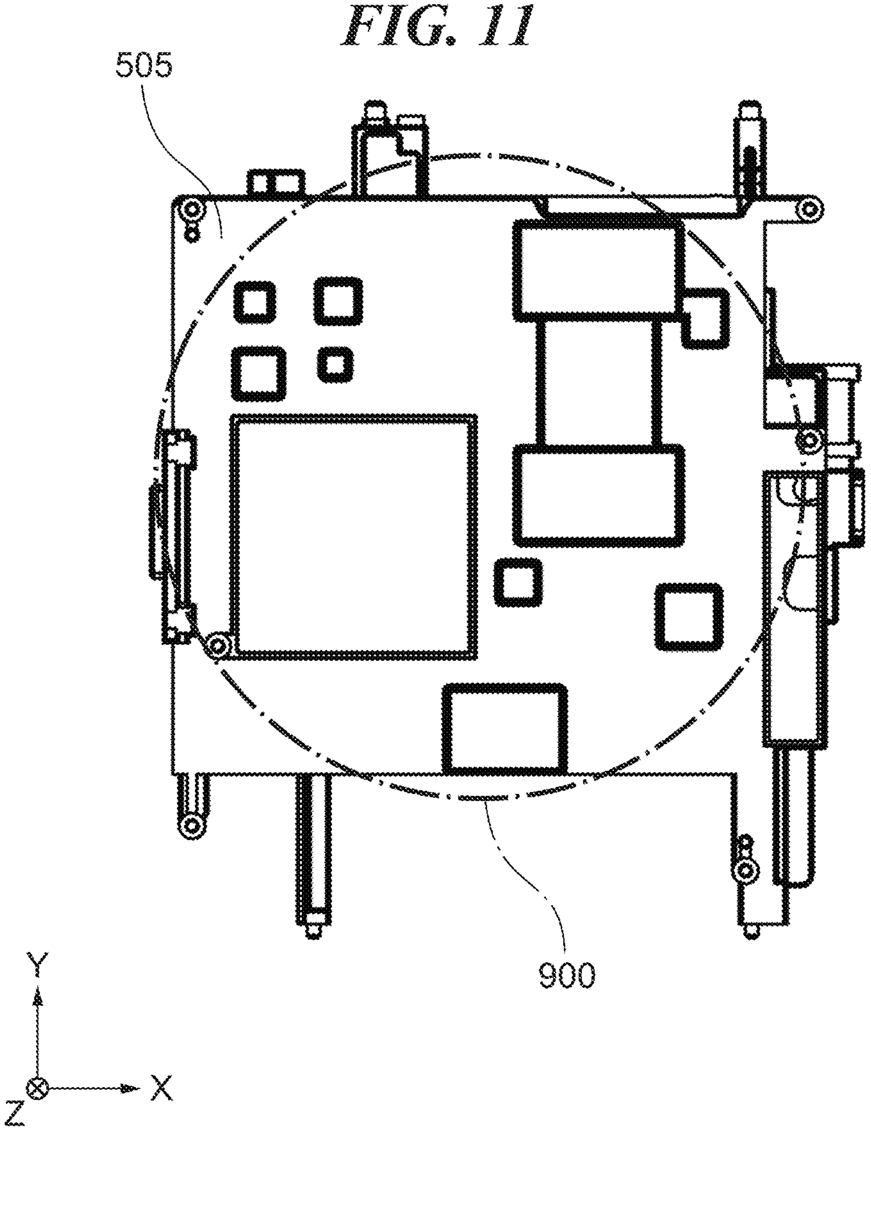
FIG. 11 is a front view of the forced air cooling duct of the image pickup apparatus to which the electronic device according to a second embodiment is applied as viewed from the front surface side of the image pickup apparatus.
Figure 12:
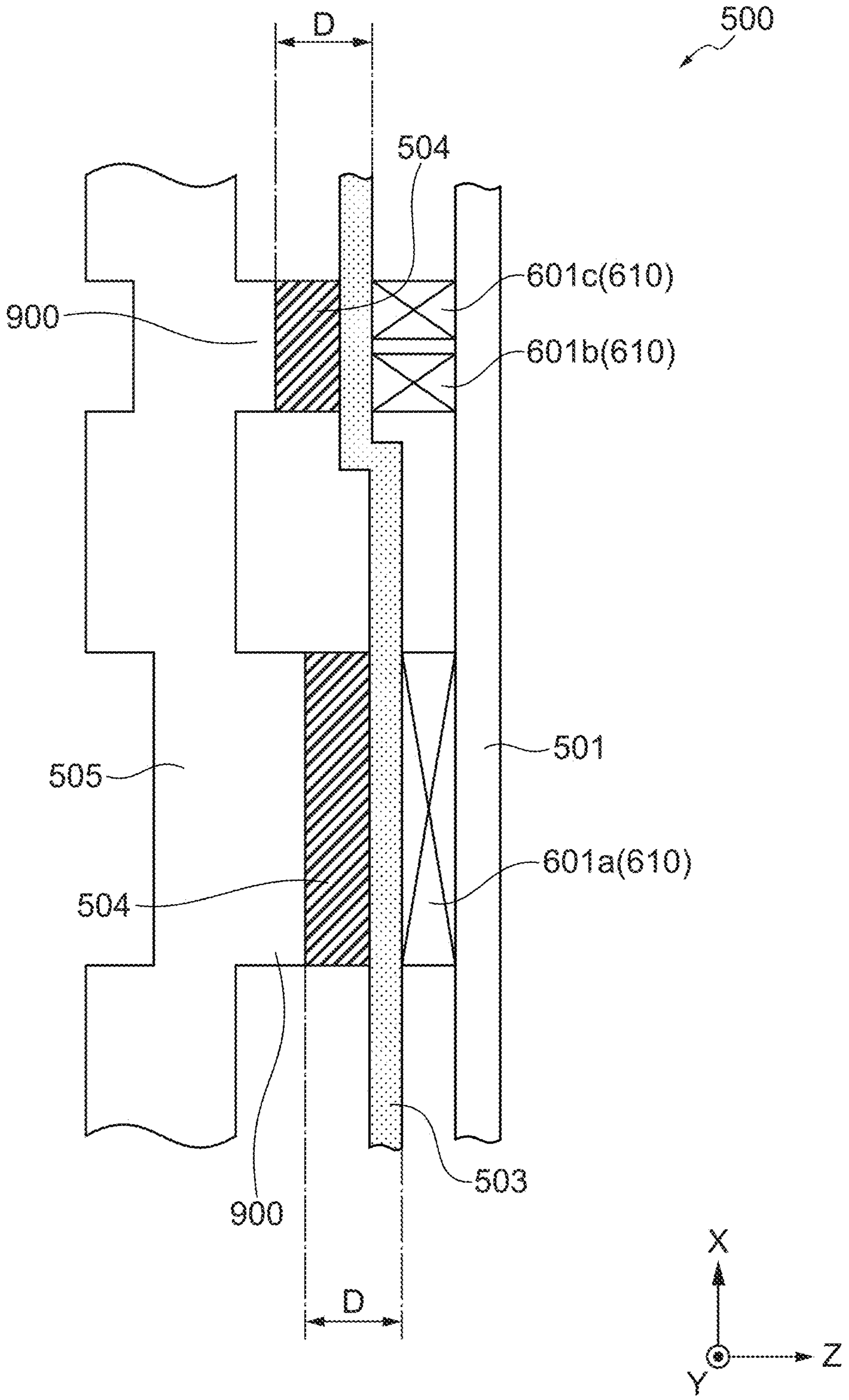
FIG. 12 is a diagram showing the positional relationship in the assembled state of the control circuit board, the film, the heat dissipation gap filler, and the forced air cooling duct.

Hereinafter, a second embodiment will be described with reference to FIGS. 11 and 12, but differences from the above-described embodiment will be mainly described, and description of similar matters will be omitted. FIG. 11 is a front view of the forced air cooling duct of the image pickup apparatus to which the electronic device according to the second embodiment is applied as viewed from the front surface side of the image pickup apparatus. FIG. 12 is a diagram showing the positional relationship in the assembled state of the control circuit board, the film, the heat dissipation gap filler, and the forced air cooling duct.

As shown in FIG. 11, the forced air cooling duct 505 has a convex shape 900 (a portion surrounded by an alternate long and short dash line in FIG. 11) projecting toward the negative side in the Z-axis direction. As shown in FIG. 12, the convex shape 900 is formed to face the heating element 610 with the heat dissipation gap filler 504 and the film 503 interposed therebetween. Thus, the convex shape 900 functions as a maintaining unit that maintains a constant distance D between the heating element 610 and the forced air cooling duct 505 in the Z-axis direction. By maintaining the distance D constant, it is possible to prevent a difference in heat transfer performance to the forced air cooling duct 505 among the heating elements 610.

Figure 13:
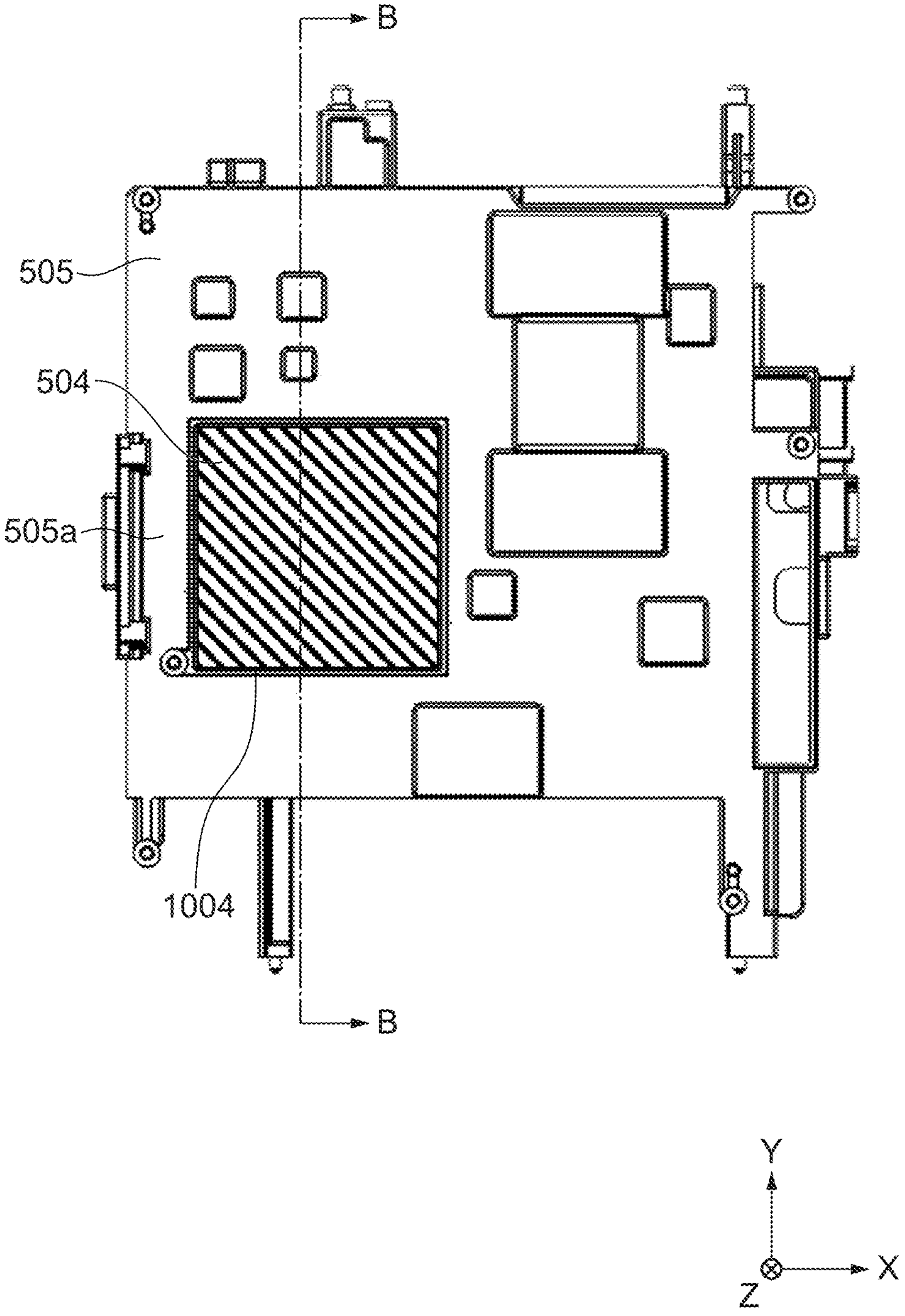
FIG. 13 is a front view of the forced air cooling duct of the image pickup apparatus to which the electronic device according to a third embodiment is applied as viewed from the front surface side of the image pickup apparatus.
Figure 14:
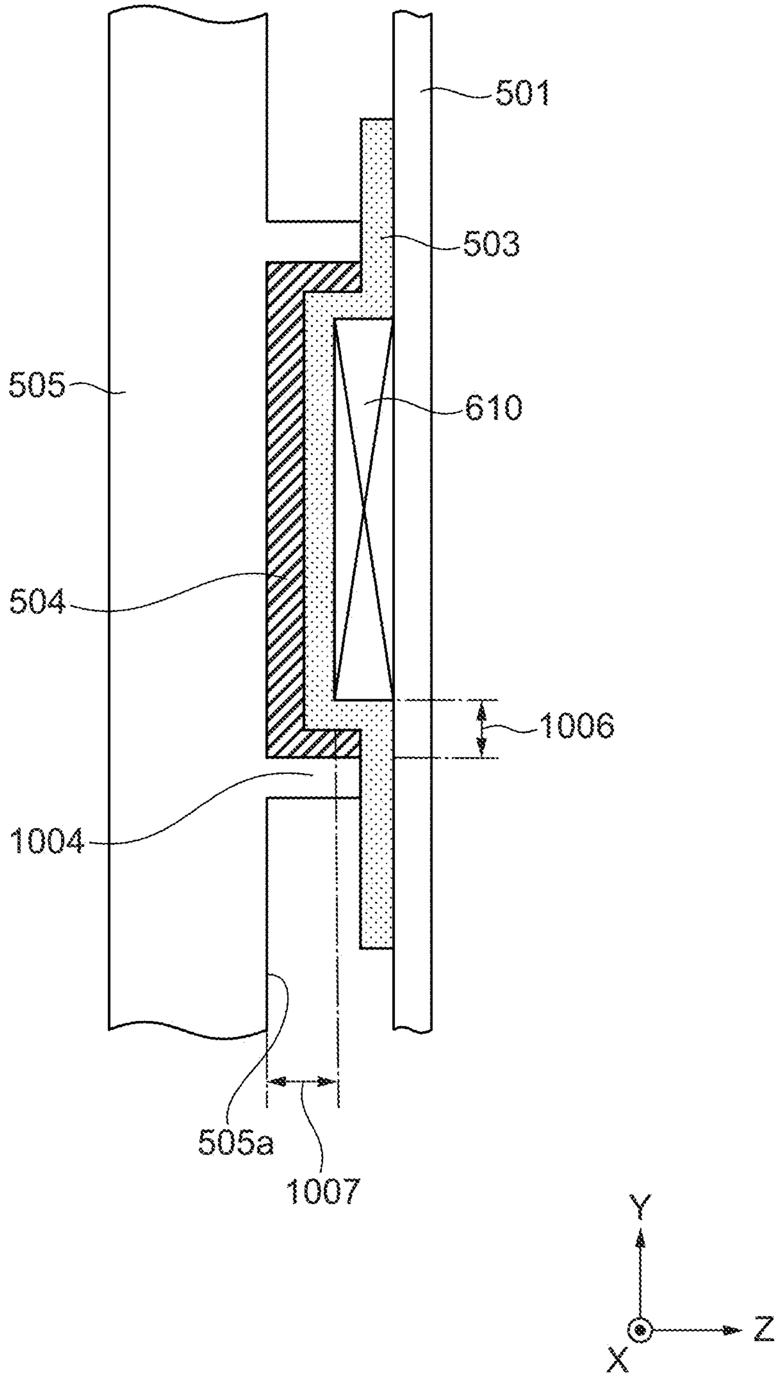
FIG. 14 is a sectional view taken along line B-B in FIG. 13.

Hereinafter, a third embodiment will be described with reference to FIGS. 13 and 14, but differences from the above-described embodiment will be mainly described, and description of similar matters will be omitted. FIG. 13 is a front view of the forced air cooling duct of the image pickup apparatus to which the electronic device according to the third embodiment is applied as viewed from the front surface side of the image pickup apparatus. The forced air cooling duct 505 has a heat dissipation rib (rib) 1004 provided to project from a surface 505*a* facing the positive side in the Z-axis direction. The heat dissipation rib 1004 is formed integrally with the forced air cooling duct 505, and has a shape surrounding the heat dissipation gap filler 504 when viewed from the Z-axis direction. FIG. 14 is a sectional view taken along line B-B in FIG. 13. As shown in FIG. 14, the heat dissipation rib 1004 surrounds the heating element 610 together with the heat dissipation gap filler 504. Thus, the film 503 is disposed between the heat dissipation gap filler 504 and the heating element 610, and can also be in contact with a side surface of the heating element 610. A contact area of the film 503 with the heating element 610 increases by an amount of contact with the side surface of the heating element 610. Thus, the heat from the heating element 610 is quickly transferred to the forced air cooling duct 505 via the film 503. A distance between the side surface of the heating element 610 and the heat dissipation rib 1004 is preferably ½ or less of the thickness of the film 503. Thus, the film 503 is compressed by the heat dissipation rib 1004 and can be reliably brought into contact with the side surface of the heating element 610.

Other Embodiments

Although the preferred embodiments of the present invention have been described above, the present invention is not limited to the above-described embodiments, and various modifications and changes can be made within the scope of the gist of the present invention. It should be noted that as an apparatus to which the electronic device of the present invention is applicable, the image pickup apparatus 100 is described in each of the above embodiments, but the present invention is not limited thereto, and for example, an information processing apparatus such as a desktop or notebook personal computer, a tablet terminal, or a smartphone may be used.

This application claims the benefit of Japanese Patent Application No. 2024-032030, filed Mar. 4, 2024 which is hereby incorporated by reference wherein in its entirety.

What is claimed is:

1. An electronic device comprising:

a circuit board having at least one heating element that generates heat by energization;

a cooling duct disposed to face the circuit board and through which air for cooling the heating element passes;

a heat dissipation filler provided in contact with a surface of the cooling duct facing the circuit board and having thermal conductivity for transferring heat from the heating element to the cooling duct;

a flexible member provided between the circuit board and the heat dissipation filler and having flexibility; and a positioning unit configured to position the flexible member at a position where contact between the circuit board and the heat dissipation filler can be prevented, wherein the heating element is provided on a surface of the circuit board facing the cooling duct, and the flexible member is sandwiched between the heating element and the heat dissipation filler.

2. The electronic device according to claim 1, wherein the positioning unit includes a through-hole provided to penetrate the flexible member, and a projecting part provided to project from the cooling duct or the circuit board and passing through the through-hole.

3. The electronic device according to claim 2, wherein at least two through-holes and at least two projecting parts are provided.

4. The electronic device according to claim 3, wherein when viewed from a normal direction of the circuit board, the two through-holes are arranged on opposite sides to each other with the heating element interposed therebetween, and the two projecting parts are also arranged on opposite sides to each other with the heating element interposed therebetween.

5. The electronic device according to claim 2, wherein the through-hole has a circular shape, and the projecting part has a columnar shape having a clearance fit relationship with the through-hole.

6. The electronic device according to claim 1, wherein the circuit board includes a plurality of the heating elements, and the positioning unit positions the flexible member so as to be able to prevent contact between each of the heating elements and the heat dissipation filler.

7. The electronic device according to claim 1, wherein the circuit board includes a connection part provided to project from a surface facing the cooling duct and is electrically connected to the cooling duct, and the flexible member includes a relief that avoids interference with the connection part.

8. The electronic device according to claim 1, wherein the flexible member has a sheet shape.

9. The electronic device according to claim 1, wherein the electronic device includes a fan that forcibly allows the air to pass through the cooling duct.

10. The electronic device according to claim 9, wherein when viewed from a normal direction of the circuit board, the circuit board, the flexible member, the heat dissipation filler, the cooling duct, and the fan are arranged in this order along the normal line.

11. The electronic device according to claim 10, wherein the electronic device is an image pickup apparatus having an image pickup function, and among the circuit board, the flexible member, the heat dissipation filler, the cooling duct, and the fan, the circuit board is located closest to a subject side.

12. The electronic device according to claim 1, wherein the circuit board includes a plurality of the heating elements provided on a surface facing the cooling duct, and the electronic device includes a maintaining unit that maintains a constant distance between the heating elements and the cooling duct in a normal direction of the circuit board.

13. The electronic device according to claim 1, wherein the cooling duct includes a rib provided to project from a surface facing the circuit board and having a shape surrounding the heating element when viewed from a normal direction of the circuit board.

14. The electronic device according to claim 1, wherein the electronic device is an image pickup apparatus having an image pickup function.

* * * * *